(12) United States Patent
Lederman et al.

(10) Patent No.: US 11,923,629 B2
(45) Date of Patent: Mar. 5, 2024

(54) DEVICE CONNECTABLE TO A PRINTED CIRCUIT BOARD WITH HIGH PRECISION

(71) Applicant: Mellanox Technologies Ltd., Yokneam (IL)

(72) Inventors: Tamir Lederman, Kiryat Tivon (IL); Aziz Mazbar, Nof Hagalil (IL); Tomer Klein, Karkur (IL); Alexander Shusterman, Yokne'am Illit (IL); Andrey Ger, Shlomi (IL)

(73) Assignee: MELLANOX TECHNOLOGIES LTD., Yokneam (IL)

( * ) Notice: Subject to any disclaimer, the term of this patent is extended or adjusted under 35 U.S.C. 154(b) by 0 days.

(21) Appl. No.: 17/548,688

(22) Filed: Dec. 13, 2021

(65) Prior Publication Data

US 2023/0187858 A1 Jun. 15, 2023

(51) Int. Cl.
*H01R 12/70* (2011.01)
*H05K 1/18* (2006.01)

(52) U.S. Cl.
CPC ......... *H01R 12/7052* (2013.01); *H05K 1/181* (2013.01); *H05K 2201/09063* (2013.01); *H05K 2201/10189* (2013.01)

(58) Field of Classification Search
CPC .................................................. H01R 12/7052
USPC ........................................................ 174/260
See application file for complete search history.

(56) References Cited

U.S. PATENT DOCUMENTS

| | | | | |
|---|---|---|---|---|
| 7,682,190 | B2* | 3/2010 | Huang | H01R 12/7064 |
| | | | | 439/571 |
| 10,826,208 | B1* | 11/2020 | Shotter | G01D 11/245 |
| 2019/0229450 | A1* | 7/2019 | Russo | H01R 13/621 |
| 2019/0393647 | A1* | 12/2019 | Nguyen | H01R 12/79 |
| 2021/0305751 | A1* | 9/2021 | Chen | H01R 13/64 |
| 2022/0131291 | A1* | 4/2022 | Chen | H01R 24/78 |

FOREIGN PATENT DOCUMENTS

KR 101442008 * 3/2014

* cited by examiner

*Primary Examiner* — Stanley Tso
(74) *Attorney, Agent, or Firm* — PEARL COHEN ZEDEK LATZER BARATZ LLP

(57) ABSTRACT

A device may include a frame, a first leg extending from the frame, and a second leg extending from the frame, wherein each of the first leg and the second leg is curved in a respective direction, the respective directions being different.

20 Claims, 5 Drawing Sheets

DEVICE CONNECTABLE TO A PRINTED CIRCUIT BOARD WITH HIGH PRECISION

FIELD OF THE INVENTION

The present invention relates to the field of devices connectable to a printed circuit board (PCB), and more particularly, to connecting devices to a PCB with high precision.

BACKGROUND OF THE INVENTION

Some devices need to be connected to a printed circuit board (PCB) with high precision. Typically, such devices are connected to the PCB in a press fit manufacturing process. However, a press fit manufacturing process is more complex than, and includes more stages than, other manufacturing processes, such as for example surface mount technology (SMT) manufacturing process.

SUMMARY OF THE INVENTION

Some embodiments of the present invention may provide a device that may include: a frame; a first leg extending from the frame; and a second leg extending from the frame; wherein each of the first leg and the second leg is curved in a respective direction, the respective directions being different.

In some embodiments, the first leg and the second leg are positioned at opposite sides of a longitudinal axis of the frame with respect to each other.

In some embodiments, the frame may include: a bottom surface; a first side surface and a second side surface being perpendicular to the bottom surface; wherein the first leg is positioned in a plane perpendicular to the bottom surface and adjacent to the first side surface; and wherein the second leg is positioned in a plane perpendicular to the bottom surface and adjacent to the second side surface.

In some embodiments, the first leg is formed as an integral portion of the first side surface and the second leg is formed as an integral portion of the second side surface.

In some embodiments, the first leg and the second leg are positioned at opposite sides of a transverse axis of the frame with respect to each other.

In some embodiments, the first leg and the second leg are curved in opposite directions with respect to each other.

In some embodiments, the device being configured to be placed on a Printed Circuit Board (PCB), the PCB may include: a first hole configured to receive the first leg and having a first hole wall, and a second hole configured to receive the second leg and having a second hole wall, wherein when the device is placed on the PCB, the first leg and the second leg deform such that a portion of the first leg contacts a respective portion of the first hole wall and a portion of the second leg contacts a respective portion of the second hole wall.

In some embodiments, the first leg and the second leg apply opposing forces on the first hole wall and the second hole wall of the PCB, respectively.

In some embodiments, each of the first leg and the second leg may include a convex surface and a concave surface being opposite to the convex surface of the respective leg.

In some embodiments, the device may include a plurality of straight legs extending from the frame.

Some embodiments of the present invention may provide an assembly that may include: a Printed Circuit Board (PCB) that may include: a first hole having a first hole wall, and a second hole having a second hole wall; and a device placed on the PCB, the device may include: a frame, a first leg extending from the frame and being placed within the first hole, the first leg is curved in a first direction and contacts the first hole wall, and a second leg extending from the frame and being placed within the second hole, the second leg is curved in a second direction that is different from the first direction and contacts the second hole wall.

In some embodiments, the first leg and the second leg apply opposing forces on the first hole wall and the second hole wall of the PCB, respectively.

In some embodiments, the first leg and the second leg are positioned at opposite sides of a longitudinal axis of the frame with respect to each other.

In some embodiments, the first leg and the second leg are positioned at opposite sides of a transverse axis of the frame with respect to each other.

In some embodiments, the first leg and the second leg are curved in opposite directions with respect to each other.

In some embodiments, each of the first leg and the second leg may include a convex surface contacting a first side of the respective hole wall.

In some embodiments, each of the first leg and the second leg may include a concave surface being opposite to the convex surface of the respective leg and being at a distance from a second side of the respective hole wall.

In some embodiments, the PCB may include a plurality of third holes, and the device may include straight legs extending from the frame and being placed within the third holes.

Some embodiments of the present invention may provide a device that may include: a first leg extending from a surface of the device, the first leg bent such that the end of the first leg is oriented in a first direction; and a second leg extending from a surface of the device, the second leg bent such that the end of the second leg is oriented in a second direction being different from the first direction.

In some embodiments, the first leg and the second leg are positioned at opposite sides of a longitudinal axis of the device and at opposite sides of a transverse axis of the device with respect to each other and are bent in opposite directions with respect to each other.

BRIEF DESCRIPTION OF THE DRAWINGS

For a better understanding of embodiments of the invention and to show how the same can be carried into effect, reference will now be made, purely by way of example, to the accompanying drawings in which like numerals designate corresponding elements or sections throughout.

In the accompanying drawings.

It will be appreciated that, for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following description, various aspects of the present invention are described. For purposes of explanation, specific configurations and details are set forth in order to provide a thorough understanding of the present invention. However, it will also be apparent to one skilled in the art that the present invention can be practiced without the specific details presented herein. Furthermore, well known features can have been omitted or simplified in order not to obscure the present invention. With specific reference to the drawings, it is stressed that the particulars shown are by way of example and for purposes of illustrative discussion of the present invention only and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention can be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that can be practiced or carried out in various ways as well as to combinations of the disclosed embodiments. Also, it is to be understood that the phraseology and terminology employed herein is for the purpose of description and should not be regarded as limiting.

Figures 1A, 1B, 1C:
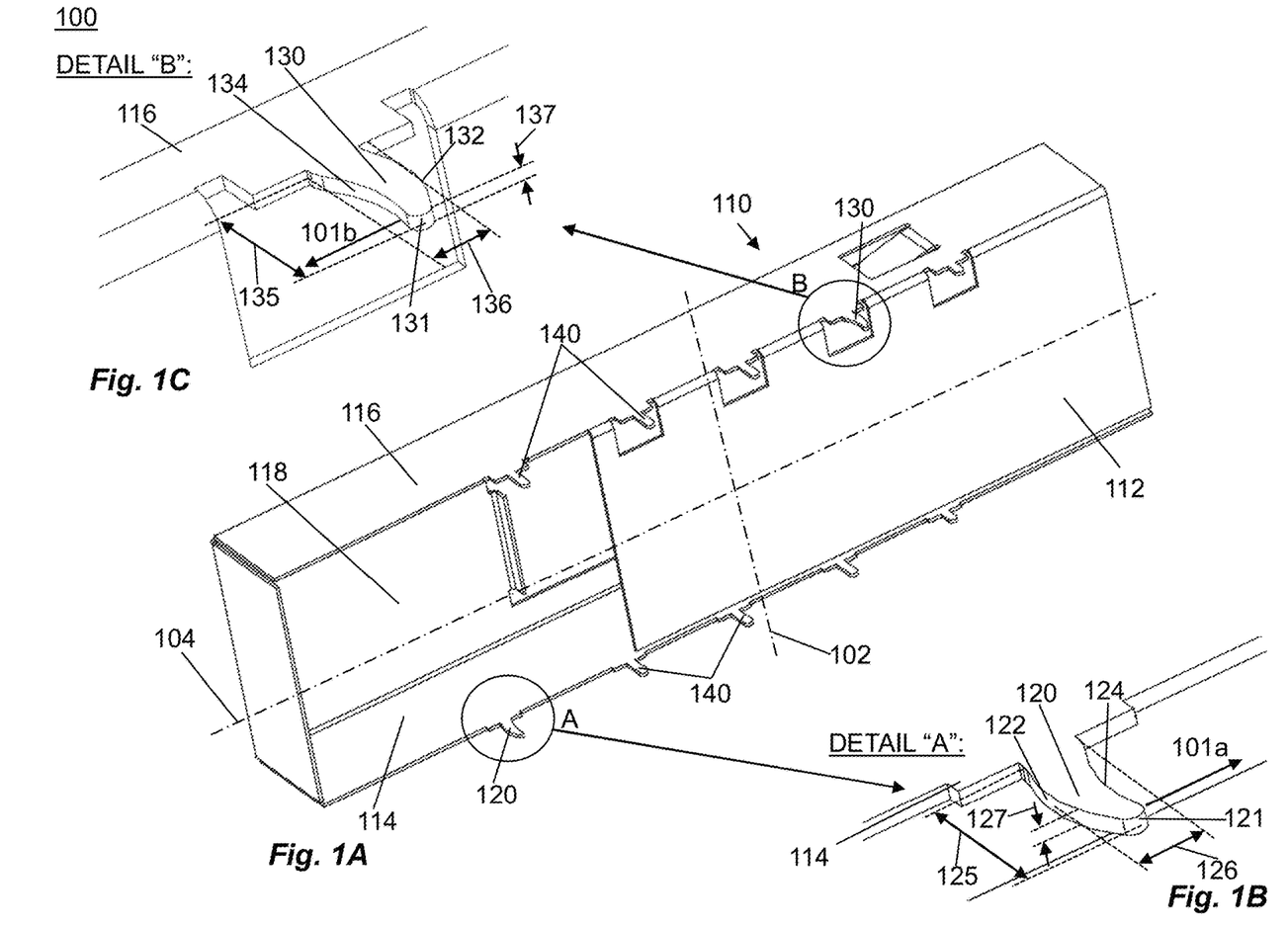
FIG. 1A is a three-dimensional (3D) diagram of a device connectable to a PCB with high precision, according to some embodiments of the invention.
FIG. 1B is a 3D diagram of an enlarged potion "A" of the device showing a first leg of the device, according to some embodiments of the invention.
FIG. 1C is a 3D diagram of an enlarged portion "B" of the device showing a second leg of the device, according to some embodiments of the invention.

Reference is now made to FIG. 1A, which is a three-dimensional (3D) diagram of a device 100 connectable to a printed circuit board (PCB) with high precision, according to some embodiments of the invention.

Reference is also made to FIG. 1B, which is a 3D diagram of an enlarged portion "A" of device 100 showing a first leg 120 of device 100, according to some embodiments of the invention.

Reference is also made to FIG. 1C, which is a 3D diagram of an enlarged portion "B" of device 100 showing a second leg 130 of device 100, according to some embodiments of the invention.

According to some embodiments of the invention, device 100 may include a frame 110, a first leg or pin 120 extending externally from frame 110 and a second leg or pin 130 extending externally from frame 110. First leg 120 and second leg 130 may extend from frame 110 in the same direction. Each of first leg 120 and second leg 130 may be curved or bent in a direction. First leg 120 and second leg 130 may be curved in different directions; first leg 120 and second leg 130 may be curved in opposite (or substantially opposite) directions with respect to each other. For example, first leg 120 may be curved such that an end 121 of first leg 120 is oriented in a first direction 101a and second leg 130 may be curved such that an end 131 of second leg 130 is oriented in a second direction 101b that is different from or opposite to first direction 101a. In the example of FIGS. 1A, 1B and 1C, first direction 101a and second direction 101b are opposite (or substantially opposite) with respect to each other, but the directions need not be opposite. In some embodiments, first leg 120 may be curved along the entire (or substantially entire) length thereof. In some embodiments, second leg 130 may be curved along the entire (or substantially entire) length thereof. While two curved legs are shown, different numbers of curved legs, e.g., one, or more than two, may extend from devices according to some embodiments.

In some embodiments, first leg 120 and second leg 130 may be positioned at opposite sides of a transverse axis 102 of frame 110 (e.g., as shown in FIG. 1A). In some embodiments, first leg 120 and second leg 130 may be positioned at opposite sides of a longitudinal axis 104 of frame 110 with respect to each other (e.g., as shown in FIG. 1A). Other positions may be used.

Frame 110 may have a bottom surface 112 (e.g., facing a PCB), a first side surface 114, a second side surface 116 and a top surface 118 (e.g., as shown in FIG. 1A). First side surface 114 and second side surface 116 may be, for example, perpendicular to bottom surface 112 of frame 110.

First leg 120 may be adjacent to or may extend from first side surface 114 of frame 110 (e.g., as shown in FIGS. 1A and 1B). First leg 120 may be parallel (or substantially parallel) to first side surface 114 of frame 110 (e.g., as shown in FIGS. 1A and 1B). First leg 120 may be an integral portion (e.g., made of the same piece of material) of first side surface 114 of frame 110 (e.g., as shown in FIGS. 1A and 1B).

Second leg 130 may be adjacent to or may extend from second side surface 116 of frame 110 (e.g., as shown in FIGS. 1A and 1C). Second leg 130 may be parallel (or substantially parallel) to second side surface 116 of frame 110 (e.g., as shown in FIGS. 1A and 1C). Second leg 130 may be an integral portion of second side surface 116 of frame 110 (e.g., as shown in FIGS. 1A and 1C).

First leg 120 and/or second leg 130 may extend from or be attached to bottom surface 112 of frame 110 (not shown). In various embodiments, first leg 120 and/or second leg 130 may be perpendicular (or substantially perpendicular) to bottom surface 112 of frame 110 (e.g., as shown in FIG. 1A). In some embodiments, frame 110, first leg 120 and second leg 130 may be formed of one piece.

First leg 120 may include a convex surface 122 (e.g., as shown in FIG. 1B). First leg 120 may include a concave surface 124 that is opposite to convex surface 122 of first leg 120 (e.g., as shown in FIG. 1B). Convex surface 122 and concave surface 124 of first leg 120 may have different radii of curvature.

Second leg 130 may include a convex surface 132 (e.g., as shown in FIG. 1C). In some embodiments, second leg 130 may include a concave surface 134 that is opposite to convex surface 132 of second leg 130 (e.g., as shown in FIG. 1C). In some embodiments, convex surface 132 and concave surface 134 of second leg 130 may have different radii of curvature.

Convex surface 122 of first leg 120 and convex surface 132 of second leg 130 may face different, e.g., opposite (or substantially opposite) directions with respect to each other (e.g., as shown in FIGS. 1A, 1B and 1C). For example, convex surface 132 of second leg 130 may face first direction 101a and convex surface 122 of first leg 120 may face second direction 101b. However, opposite directions need not be used.

In some embodiments, first leg 120 and second leg 130 may be made of an elastic or springy material. For example, first leg 120 and second leg 130, as well as frame 110, may be made of, or may include, stainless steel, copper or any other material known in the art, which is elastic when formed in certain dimensions, such as the small dimensions used with some embodiments of the legs. In one example, first leg 120 may have a longitudinal dimension 125 (measured from a connection point of first leg 120 to frame 110) within a range of 2.6 and 3.0 mm (e.g., 2.6 mm), a maximal transverse dimension 126 (measured as a distance between most distal points on convex surface 122 and on concave surface 124 of first leg 120) within a range of 1.0 and 1.1 mm (e.g., 1.08 mm), and a thickness 127 within a range of 0.22 and 0.28 mm (e.g., 0.25 mm). In the same example, second leg 130 may have a longitudinal dimension 135 (measured from a connection point of second leg 130 to frame 110) within a range of 2.6 and 3.0 mm (e.g., 2.6 mm), a maximal transverse dimension 136 (measured as a distance between most distal points on convex surface 132 and on concave surface 134 of second leg 130) within a range of 1.0 and 1.1 mm (e.g., of 1.08 mm), and a thickness 137 within a range of 0.22 and 0.28 mm (e.g., 0.25 mm).

Device 100 may include straight legs or pins 140 (including, e.g., conical, frustoconical, etc.) in addition to curved legs or pins. Straight legs 140 may extend externally from frame 110 in the same direction as first leg 120 and second leg 130 (and other curved legs if there are more than two). For example, device 100 may include a first set of straight legs 140 being adjacent to or extending from first side surface 114 of frame 110 and a second set of straight legs 140 being adjacent to or extending from second side surface 116 of frame 110. Straight legs 140 may be parallel (or substantially parallel) to first side surface 114 and second side surface 116 of frame 110 and/or perpendicular (or substantially perpendicular) to bottom surface 112 of frame 110. In some embodiments, straight legs 140 and frame 110 may be formed of one piece.

Device 100 may be, for example, a transceiver receptacle cage, as shown in FIGS. 1A-1C and FIGS. 2A-2H. While device 100 is shown in FIGS. 1A-1C and in FIGS. 2A-2H as a transceiver receptacle case, other devices may include components described herein.

Figure 2A:
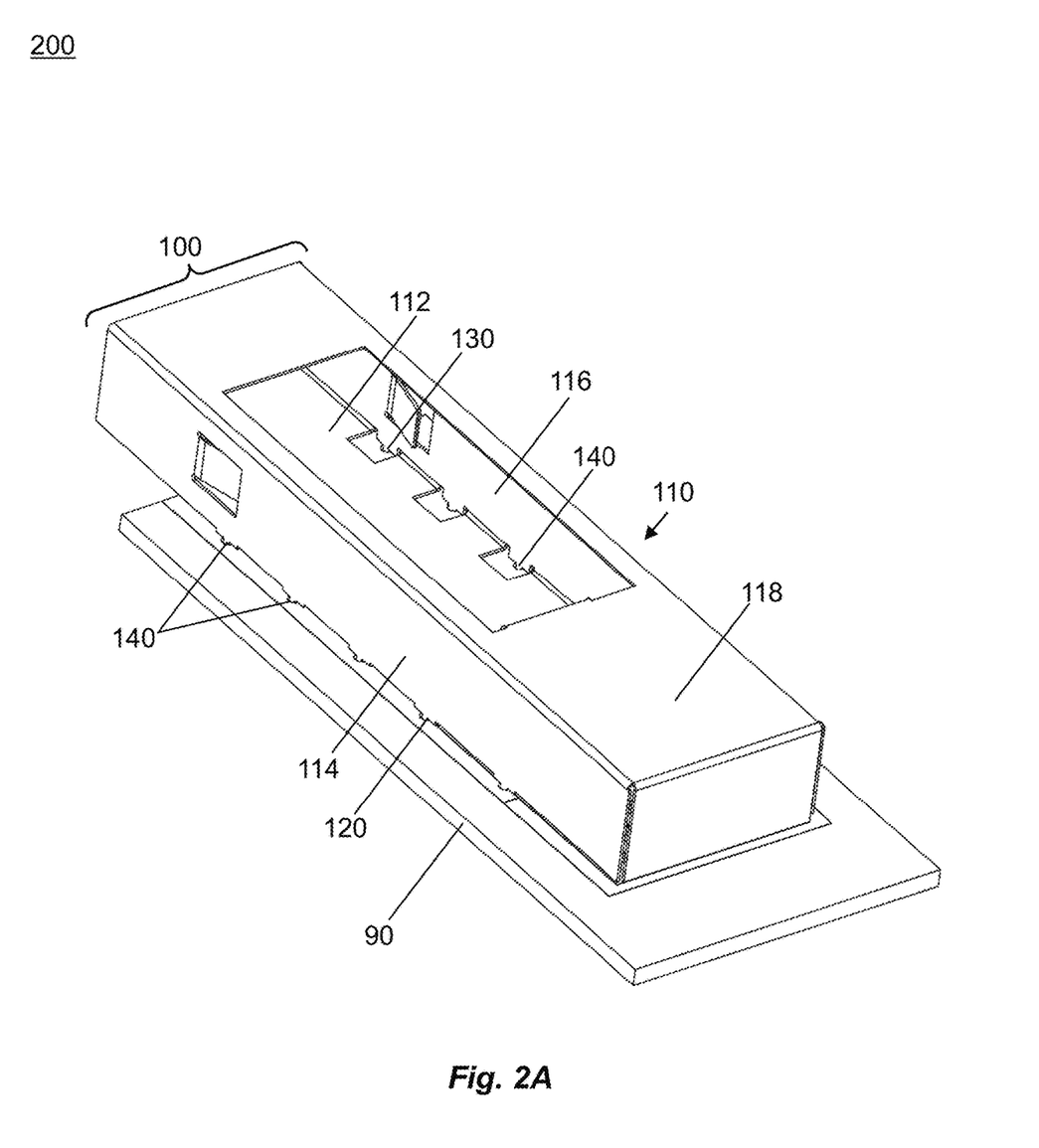
FIG. 2A is a 3D diagram of an assembly including the device and the PCB, according to some embodiments of the invention.

Reference is now made to FIG. 2A, which is a 3D diagram of an assembly 200 including device 100 and PCB 90, according to some embodiments of the invention.

Figure 2B:
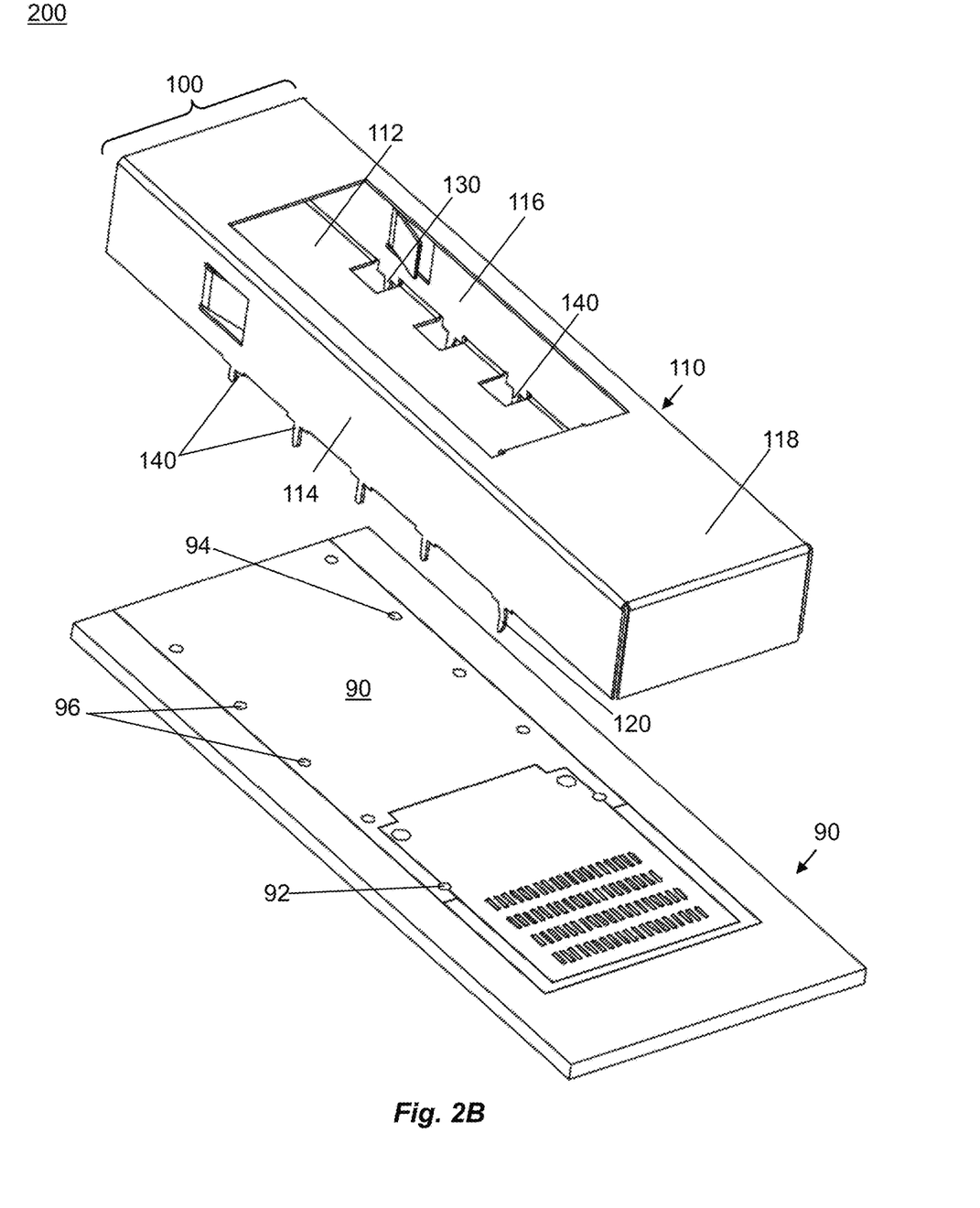
FIG. 2B is a 3D diagram of an exploded view of the assembly, according to some embodiment some embodiments of the invention.

Reference is also made to FIG. 2B, which is a 3D diagram of an exploded view of assembly 200, according to some embodiment some embodiments of the invention.

Figure 2C:
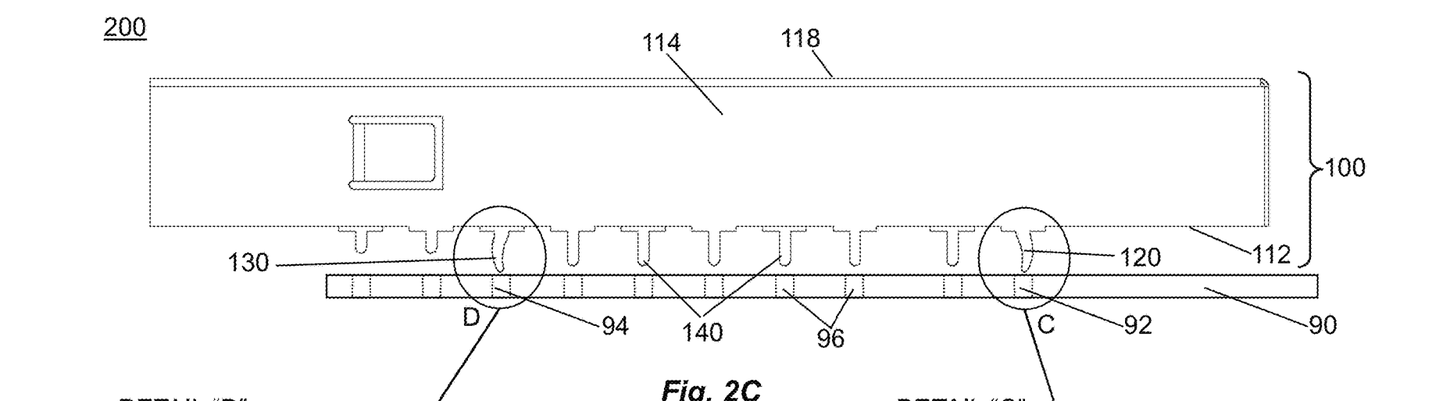
FIG. 2C is a schematic exploded side view of the assembly, according to some embodiments of the invention.

Reference is also made to FIG. 2C, which is a schematic exploded side view of assembly 200, according to some embodiments of the invention.

Figure 2D:
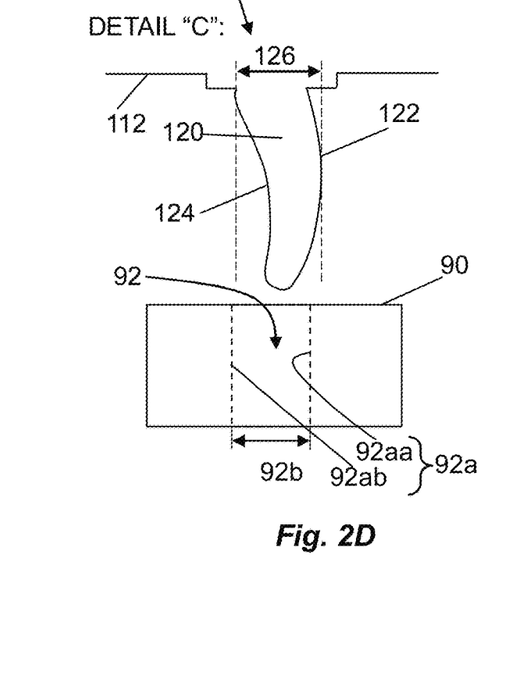
FIG. 2D is a schematic exploded side view of an enlarged portion "C" of the assembly showing the first leg of the device and a first hole of the PCB, according to some embodiments of the invention.

Reference is also made to FIG. 2D, which is a schematic exploded side view of an enlarged portion "C" of assembly 200 showing first leg 120 of device 100 and a first hole 92 of PCB 90, according to some embodiments of the invention.

Figure 2E:
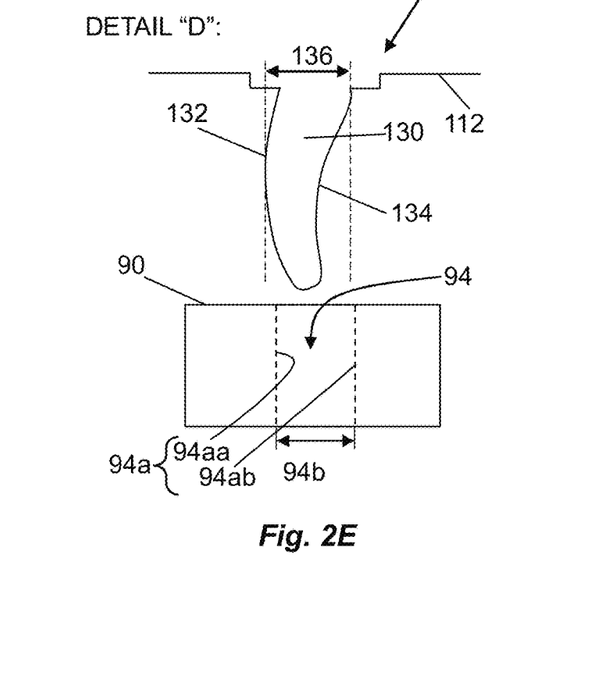
FIG. 2E is a schematic exploded side view of an enlarged portion "D" of the assembly showing the second leg of the device and a second hole of the PCB, according to some embodiments of the invention.

Reference is also made to FIG. 2E, which is a schematic exploded side view of an enlarged portion "D" of assembly 200 showing second leg 130 of device 100 and a second hole 94 of PCB 90, according to some embodiments of the invention.

Figure 2F:
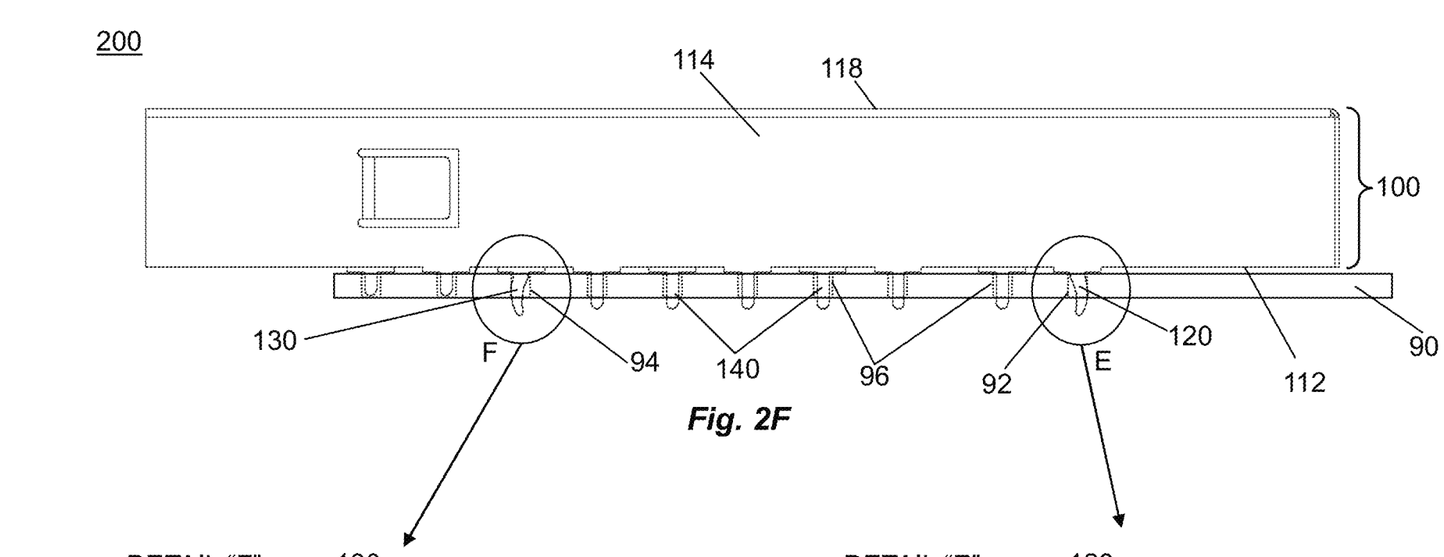
FIG. 2F is a schematic side view of the assembly, according to some embodiments of the invention.

Reference is also made to FIG. 2F, which is a schematic side view of assembly 200, according to some embodiments of the invention.

Figure 2G:
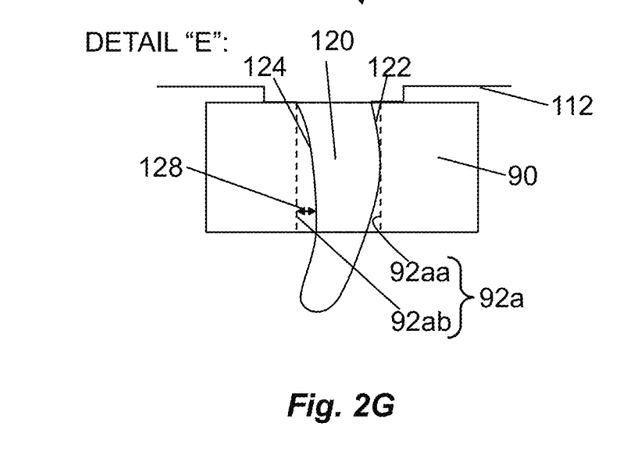
FIG. 2G is a schematic side view of an enlarged portion "E" of the assembly showing the first leg of the device positioned in the first hole of the PCB, according to some embodiments of the invention.

Reference is also made to FIG. 2G, which is a schematic side view of an enlarged portion "E" of assembly 200 showing first leg 120 of device 100 positioned in first hole 92 of PCB 90, according to some embodiments of the invention.

Figure 2H:
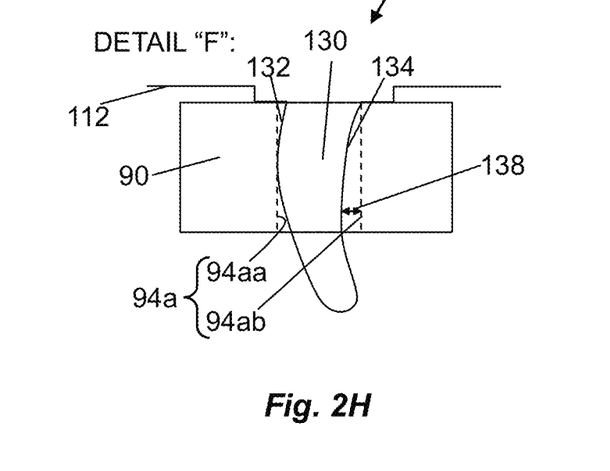
FIG. 2H is a schematic side view of an enlarged portion "F" of the assembly showing the second leg of the device positioned in the second hole of the PCB, according to some embodiments of the invention.

Reference is also made to FIG. 2H, which is a schematic side view of an enlarged portion "F" of assembly 200 showing second leg 130 of device 100 positioned in second hole 94 of PCB 90, according to some embodiments of the invention.

Device 100 may be placed on or connected to PCB 90 (e.g., as shown in FIG. 2A). For example, PCB 90 may include a first hole 92 having a first hole wall 92a and a second hole 94 having a second hole wall 94a. First hole 92 of PCB 90 may receive first leg 120 of device 100 and second hole 94 of PCB 90 may receive second leg 130 of device 100 when device 100 is placed on PCB 90. PCB 90 may include third holes 96 that may receive straight legs 140 of device 100 when device 100 is placed on PCB 90.

First leg 120 may have maximal transverse dimension 126 (measured as a distance between most distal points on convex surface 122 and on concave surface 124) that is greater than a minimal transverse dimension 92b (e.g., a diameter) of first hole 92 (e.g., as shown in FIG. 2D). Second leg 130 may have maximal transverse dimension 136 (measured as a distance between most distal points on convex surface 132 and on concave surface 134) that is greater than a minimal transverse dimension 94b (e.g., a diameter) of second hole 94 (e.g., as shown in FIG. 2E). Third legs 140 may have a maximal transverse dimension that is smaller than a maximal transverse dimension (e.g., a diameter) of third holes 96 (e.g., as shown in FIG. 2F).

When device 100 is placed on PCB 90 and pressed towards PCB 90, first leg 120 and second leg 130 may deform and respective portions of first leg 120 and second leg 130 may contact first hole wall 92a and second hole wall 94a of PCB 90, respectively (e.g., as shown in FIGS. 2F, 2G and 2H). For example, convex surface 122 of first leg 120 may contact a first side 92aa of first hole wall 92a, and concave surface 124 of first leg 120 may be at a distance 128 from a second side 92ab of first hole wall 92a (e.g., as shown in FIG. 2G). In the same example, convex surface 132 of second leg 130 may contact a first side 94aa of second hole wall 94a, and concave surface 134 of second leg 130 may be at a distance 138 from a second side 94ab of second hole wall 94a (e.g., as shown in FIG. 2H).

First leg 120 and second leg 130 of device 100 being curved or bent (e.g., in opposing directions) may thus apply forces (e.g., opposing forces) on first hole wall 92a and second hole wall 94a of PCB 90, respectively. First leg 120 and second leg 130 of device 100 applying opposing forces on PCB 90 may ensure pc. Curved legs may apply spring-like forces in more than one direction within a curved hole, causing device 100 to be firmly fixed in place. Since only portions of first leg 120 and second leg 130 contact first hole wall 94a and second hole wall 94a of PCB 90, respectively, and straight legs 140 may contact third hole walls 96a only weakly or not contact third hole walls 96a at all (e.g., as shown in FIGS. 2F, 2G and 2H), relatively low forces of, e.g., up to 15 N, need to be applied to device 100 to place device 100 on PCB 90. Accordingly, device 100 having first leg 120 and second leg 130 may be placed on PCB 90 in, for example, surface mount technology (SMT) manufacturing process. This in contrast to a device having prior art high precision positioning legs configured to fit tightly within PCB holes and requiring application of relatively high forces (e.g., of about 167-440 N) to the device to place the device on the PCB. Accordingly, devices having prior art high precision positioning legs are typically placed on the PCB in a press fit manufacturing process, which is more complex and includes more stages than, for example, the SMT manufacturing process.

Advantageously, first leg 120 and second leg 130 of device 100 according to some embodiments of the present invention may enable placing device 100 on PCB 90 with high precision in, for example, SMT manufacturing process, thus saving manufacturing time and labor.

In the above description, an embodiment is an example or implementation of the invention. The various appearances of "one embodiment", "an embodiment", "certain embodiments" or "some embodiments" do not necessarily all refer to the same embodiments. Although various features of the invention can be described in the context of a single embodiment, the features can also be provided separately or in any suitable combination. Conversely, although the invention can be described herein in the context of separate embodiments for clarity, the invention can also be implemented in a single embodiment. Certain embodiments of the invention can include features from different embodiments disclosed above, and certain embodiments can incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

The invention claimed is:

1. A device connectable to a printed circuit board (PCB), the device comprising:
   a frame;
   a first leg and a second leg, each of the first leg and the second leg extending directly from the frame without any intervening structure disposed between the frame and the respective leg
   wherein each of the first leg and the second leg is curved in a respective direction along the entire length thereof, the respective directions being different;
   wherein when the device is placed on the PCB having a first PCB hole and a second PCB hole:
   each of the first leg and the second leg deforms in a spring-like manner and remains deformed in one of the first PCB hole and the second PCB hole, respectively, such that only a portion of a convex surface of each respective leg contacts one side of an inner surface of a wall of the respective PCB hole and wherein no other portions of the respective leg contact any other side of the inner surface of the wall of the respective PCB hole.

2. The device of claim 1, wherein the first leg and the second leg are positioned at opposite sides of a longitudinal axis of the frame with respect to each other.

3. The device of claim 1, wherein the frame comprises:
   a bottom surface;
   a first outer side surface and a second outer side surface being perpendicular to the bottom surface;
   wherein the first leg is formed as an integral portion of the first outer side surface; and
   wherein the second leg is formed as an integral portion of the second outer side surface.

4. The device of claim 1, wherein the first leg and the second leg are positioned at opposite sides of a transverse axis of the frame with respect to each other.

5. The device of claim 1, wherein the first leg and the second leg are curved in opposite directions with respect to each other.

6. The device of claim 1, wherein the first leg and the second leg apply opposing forces on the inner surface of the wall of the first PCB hole and the inner surface of the wall of the second PCB hole, respectively.

7. The device of claim 1, further comprising a plurality of straight legs extending from the frame.

8. The device of claim 1,
   wherein only a portion of the convex surface of the first leg contacts one side of the inner surface of the wall of the first PCB hole, and
   wherein only a portion of the convex surface of the second leg contacts one side of the inner surface of the wall of the second PCB hole.

9. The device of claim 1,
   wherein a concave surface of the first leg is at a distance from a second side of the inner surface of the wall of the first PCB hole, and
   wherein a concave surface of the second leg is at a distance from a second side of the inner surface of the wall of the second PCB hole.

10. The device of claim 1, wherein the first leg and the second leg apply opposing forces on the inner surface of the wall of the first PCB hole and the inner surface of the wall of the second PCB hole, respectively, in directions that are parallel to the PCB to ensure proper positioning of the device with respect to the PCB.

11. An assembly comprising:
a Printed Circuit Board (PCB) comprising:
   a first hole having a first PCB hole, and
   a second hole having a second PCB hole; and
a device placed on the PCB, the device being connectable to the PCB and comprising:
   a frame,
   a first leg and a second leg, each of the first leg and the second leg extending from the frame and being placed within one of the first PCB hole and the second PCB hole, respectively, each respective leg being deformed in a spring-like manner and remains deformed in the respective PCB hole, each respective leg being curved in a respective direction, the respective directions being different, each respective leg comprises a convex surface a portion of which contacts an inner surface of a wall of the respective PCB hole;
wherein the first leg and the second leg apply opposing forces on the inner surface of the wall of the first PCB hole and the inner surface of the wall of the second PCB hole, respectively.

12. The assembly of claim 11, wherein the first leg and the second leg are positioned at opposite sides of a longitudinal axis of the frame with respect to each other.

13. The assembly of claim 11, wherein the first leg and the second leg are positioned at opposite sides of a transverse axis of the frame with respect to each other.

14. The assembly of claim 11, wherein the first leg and the second leg are curved in opposite directions with respect to each other.

15. The assembly of claim 11, wherein each of the first leg and the second leg comprises a concave surface being opposite to the convex surface of the respective leg and being at a distance from a second side of the inner surface of the wall of the respective PCB hole.

16. The assembly of claim 11,
wherein the PCB comprises a plurality of third holes, and
wherein the device comprises straight legs extending from the frame and being placed within the third holes.

17. The assembly of claim 11, wherein the first leg and the second leg apply opposing forces on the inner surface of the wall of the first PCB hole and the inner surface of the wall of the second PCB hole, respectively, in directions that are parallel to the PCB to ensure proper positioning of the device with respect to the PCB.

18. A device connectable to a printed circuit board (PCB), the device comprising:
   a first leg and a second leg, each of the first leg and the second leg extending directly from a surface of the device without any intervening structure disposed between the surface and the respective leg, the first leg bent such that the end of the first leg is oriented in a first direction, and
   the second leg bent such that the end of the second leg is oriented in a second direction being different from the first direction;
wherein when the device is placed on the PCB having a first PCB hole and a second PCB hole:
   each of the first leg and the second leg deforms in a spring-like manner and remains deformed in one of the first PCB hole and the second PCB hole, respectively, such that only a portion of a convex surface of each respective leg contacts one side of an inner surface of a wall of the respective PCB hole and wherein no other portions of the respective leg contact any other side of the inner surface of the wall of the respective PCB hole.

19. The device of claim 18, wherein the first leg and the second leg are positioned at opposite sides of a longitudinal axis of the device and at opposite sides of a transverse axis of the device with respect to each other and are bent in opposite directions with respect to each other.

20. A device connectable to a printed circuit board (PCB), the device comprising:
   a frame;
   two legs extending directly from the frame without any intervening structure disposed between the frame and each of the legs;
wherein each of the legs is curved in a respective direction along the entire length thereof, the respective directions being different;
wherein when the device is placed on the PCB having two PCB holes, each PCB hole corresponding to one of the legs:
   the legs deform in a spring-like manner and remain deformed in the corresponding PCB hole such that only a portion of a convex surface of each leg contacts only one side of an inner surface of a wall of the corresponding PCB hole, and wherein no other portions of the legs contact any other side of the inner surface of the wall of the corresponding PCB hole.

* * * * *